(12) United States Patent
Kloen et al.

(10) Patent No.: US 6,229,221 B1
(45) Date of Patent: May 8, 2001

(54) INTEGRATED CIRCUIT DEVICE

(75) Inventors: Hendrik K. Kloen; Lodewijk P. Huiskamp, both of Nijmegen (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/455,123

(22) Filed: Dec. 6, 1999

(30) Foreign Application Priority Data

Dec. 4, 1998 (EP) .................................................. 98204126

(51) Int. Cl.[7] ........................ H01L 23/48; H01L 23/52; H01L 29/40
(52) U.S. Cl. ............................................ 257/784; 257/781
(58) Field of Search ................................. 257/784, 786, 257/780, 781

(56) References Cited

U.S. PATENT DOCUMENTS

| | | | |
|---|---|---|---|
| 5,365,112 | * 11/1994 | Ohshsima . | |
| 5,539,244 | * 7/1996 | Mori et al. . | |
| 5,719,448 | * 2/1998 | Ichikawa . | |
| 5,773,899 | 6/1998 | Zambrano | ........................... 257/784 |
| 5,925,931 | * 7/1999 | Yammamoto . | |
| 5,962,918 | * 10/1999 | Kimura . | |
| 6,150,725 | * 11/2000 | Misawa et al. . | |

FOREIGN PATENT DOCUMENTS

0587442A2   3/1994 (EP) .

* cited by examiner

Primary Examiner—Sheila V. Clark
(74) Attorney, Agent, or Firm—Steven R. Biren

(57) ABSTRACT

An integrated circuit device comprises an active circuit 4 provided in an active circuit area at a surface 5 of a semiconductor body 6, a plurality of bond pads 3 disposed substantially over the active circuit area and electrical connections between the bond pads 3 and the active circuit 4. Each one of the bond pads 3 has a wire-bonding region 23 for bonding a wire 24 and a circuit-connecting region 22 for the electrical connection with the active circuit 4. The active circuit 4 comprises active circuit devices 7, an interconnect structure comprising at least one patterned metal layer disposed in overlying relationship relative to the active circuit devices 7 and a layer 20 of passivating material disposed atop the interconnect structure, through which the electrical connections pass. The layer 20 of passivating material substantially consists of inorganic material and is substantially free from interruptions beneath the wire-bonding region 23 of the bond pads 3. The bond pads 3 and the layer 20 of passivating material have thicknesses that jointly counteract the occurrence of damage to the active circuit 4 during bonding of the wire 24 to the wire-bonding region 23.

8 Claims, 4 Drawing Sheets

INTEGRATED CIRCUIT DEVICE

BACKGROUND OF THE INVENTION

The invention relates to an integrated circuit device comprising:

an active circuit provided in an active circuit area at a surface of a semiconductor body, said active circuit comprising active circuit devices, an interconnect structure comprising at least one patterned metal layer disposed in overlying relationship relative to the active circuit devices and a layer of passivating material disposed atop the interconnect structure, a plurality of bond pads, each providing a wire-bonding region for bonding a wire, said bond pads being disposed substantially over the active circuit area, electrical connections between the bond pads and the active circuit devices, said electrical connections extending from a circuit-connecting region provided by the bond pads and passing through the layer of passivating material.

An integrated circuit device of the type mentioned in the opening paragraph is known from EP-A-0,587,442. The integrated circuit device described therein comprises active circuit devices provided in an active circuit area at a surface of a semiconductor body. In overlying relationship relative to the active circuit devices, an interconnect structure is disposed, which is provided with a layer of passivating material. On top of the layer of passivating material a plurality of bond pads is disposed which extend substantially over the active circuit area and are electrically connected to the active circuit devices through the layer of passivating material. In order to counteract the occurrence of damage to the active circuit area of the integrated circuit device due to forces exerted during bonding of a wire to each one of the bond pads, the layer of passivating material is composed of a polyimide. Alternatively, the layer of passivating material may be a polyimide layer on top of a silicon nitride or a silica layer. The polyimide absorbs and controls stresses transmitted from the bond pads to the active circuit area and, hence, provides for stress relief during wire bonding. Preferably, special requirements are imposed on certain physical properties of the polyimide applied, such as modulus of elasticity, coefficient of thermal expansion and dielectric constant.

A disadvantage of the known integrated circuit device is that, whereas conventional integrated circuit devices having bond pads arranged peripherally outside of the active circuit area rely on an inorganic passivating material, application of an additional or substitutive organic passivating material, i.e. a polyimide, is needed for stress relief in case the bond pads are disposed substantially over the active circuit area, thereby increasing the complexity of the integrated circuit device and its manufacturing process.

SUMMARY OF THE INVENTION

It is an object of the invention to provide an integrated circuit device of the kind mentioned in the opening paragraph, which can withstand the forces exerted during wire bonding and, hence, counteract the occurrence of damage to the active circuit without an increase in device and process complexity.

According to the invention, this object is achieved in that
the circuit-connecting region of the bond pads is situated substantially outside of the wire-bonding region of the bond pads, the layer of passivating material substantially consists of inorganic material, the layer of passivating material beneath the wire-bonding region of the bond pads is substantially free from interruptions, the layer of passivating material and the bond pads have thicknesses that jointly counteract the occurrence of damage to the active circuit during bonding of the wire.

It has been found experimentally that the thicknesses of the bond pads and the layer of passivating material consisting substantially of conventional inorganic material can be chosen to be such that the integrated circuit device is capable of withstanding the forces exerted during wire bonding, provided the circuit-connecting region of the bond pads is situated substantially outside of the wire-bonding region of the bond pads and the layer of passivating material is substantially free from interruptions beneath the wire-bonding region of the bond pads. In this way, application of an additional or substitutive organic passivating material such as a polyimide is not required for stress relief during wire bonding.

An embodiment of the integrated circuit device according to the invention is characterized in that the wire-bonding region of the bond pads and the circuit-connecting region of the bond pads are part of one common layer. The use of a common layer for both the wire-bonding region of the bond pads and the circuit-connecting region of the bond pads reduces the complexity of the integrated circuit device and its manufacturing process.

An embodiment of the integrated circuit device according to the invention is characterized in that the wire-bonding region of the bond pads is located substantially at the periphery of the active circuit area. In this way, wires electrically connecting the bond pads disposed over the active circuit area to an external lead structure provided by a package surrounding the integrated circuit device, can be kept as short as possible. Consequently, the resistance of the wires and the associated tension losses during operation of the integrated circuit device can be minimized.

An embodiment of the integrated circuit device according to the invention is characterized in that the bond pads comprise aluminium. Aluminium, either pure or as an alloy with a few percent of silicon and/or copper, exhibits a relatively low electrical resistivity compared to other metals. Furthermore, the application of pure or alloyed aluminium for the bond pads is compatible with the processing of previously applied metal layers, since the latter are commonly composed of pure or alloyed aluminium as well.

An embodiment of the integrated circuit device according to the invention is characterized in that the layer of passivating material comprises silicon nitride. Silicon nitride is frequently used as a passivating material, because it provides an impermeable barrier to moisture and mobile impurities, such as sodium, and in addition forms a tough coat that protects the integrated circuit device against scratching.

An embodiment of the integrated circuit device according to the invention is characterized in that the layer of passivating material has a thickness of at least 1.2 $\mu$m and that the bond pads have a thickness of at least 1.1 $\mu$m. It has been found experimentally that an integrated circuit device is able to withstand the forces exerted during wire bonding if the layer of passivating material comprising silicon nitride has a thickness of at least 1.2 $\mu$m and the bond pads comprising aluminium have a thickness of at least 1.1 $\mu$m.

An embodiment of the integrated circuit device according to the invention is characterized in that the layer of passivating material has a thickness in the range of about 1.4 to 2.0 $\mu$m and that the bond pads have a thickness in the range of about 2 to 3 µm. In order to attain an overall process yield equal to that obtained during manufacturing conventional integrated circuit devices having the bond pads arranged peripherally outside of the active circuit area, it is advantageous to apply the layer of passivating material comprising silicon nitride and the bond pads comprising aluminium in thicknesses lying in the above mentioned ranges. Moreover, from a process technical viewpoint it is desirable to keep the thicknesses as small as possible.

An embodiment of the integrated circuit device according to the invention is characterized in that the wire comprises gold. Gold has a relatively high electrical conductivity and is relatively easy to process compared to, for instance, aluminium.

BRIEF DESCRIPTION OF THE DRAWING

These and other aspects of the invention will be apparent from and elucidated with reference to the embodiments described hereafter. In the drawing.

For the sake of clarity, the invention is hereinafter illustrated on the basis of an integrated circuit device containing a few MOS transistors only. It will be evident, however, to those skilled in the art that the integrated circuit device may contain a plurality of active circuit devices, which need not be restricted to MOS transistors, but may include bipolar transistors or DMOS/VDMOS transistors as well. Accordingly, the invention is applicable to CMOS and BICMOS integrated circuit devices in general.

DESCRIPTION OF THE PREFERRED EMBODIMENTS

Figure 1:
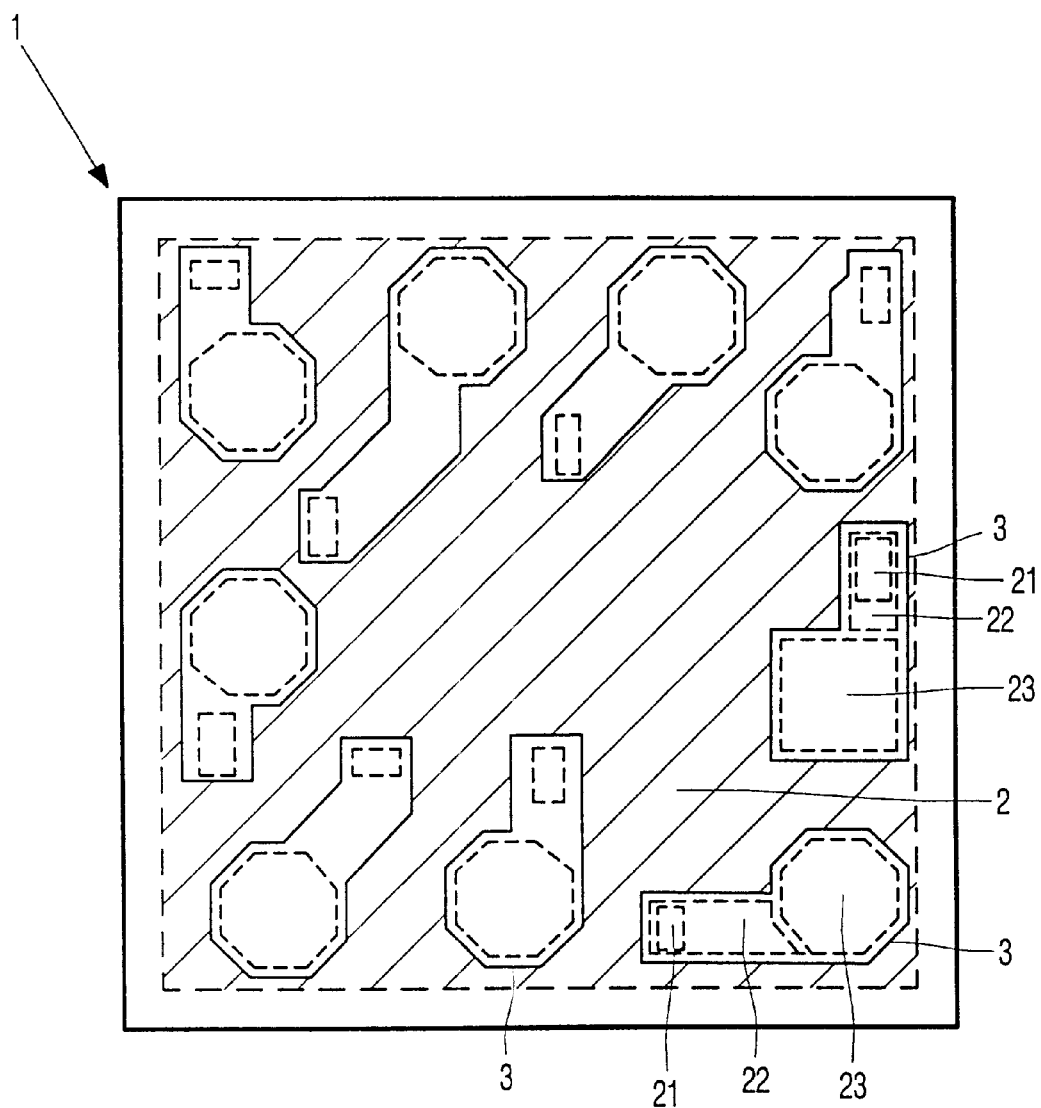
FIG. 1 is a schematic top view showing a plurality of bond pads disposed over an active circuit area of an integrated circuit device in accordance with the invention.
Figure 2:
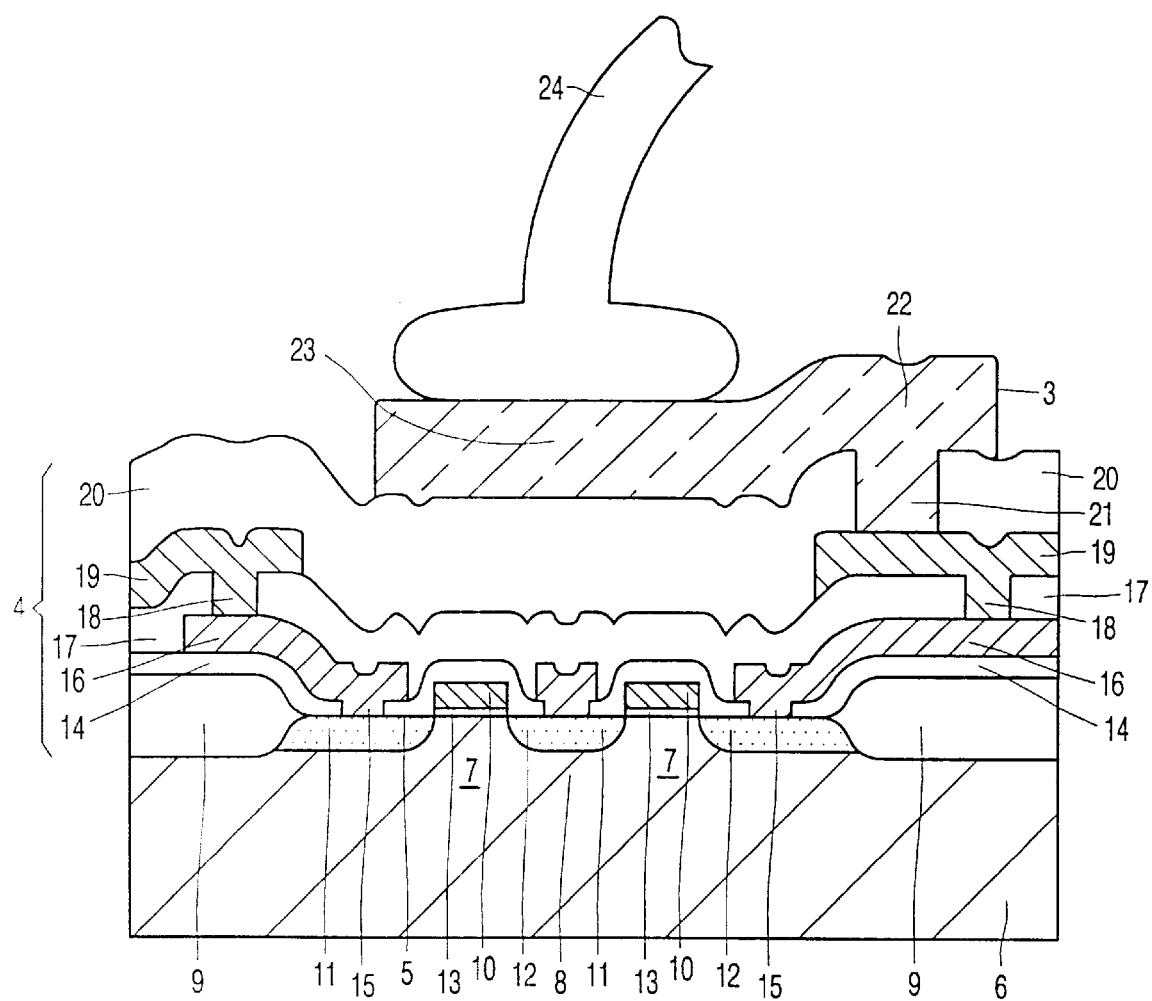
FIG. 2 is a diagrammatic cross-sectional view of an active circuit, only a part of which is shown, which is provided in an active circuit area of an integrated circuit device in accordance with the invention.

FIG. 1 represents a schematic top view showing a plurality of bond pads 3 disposed over an active circuit area 2 of an integrated circuit device 1 in accordance with the invention. The structure of the integrated circuit device 1 will be better understood from the diagrammatic cross-sectional view of an active circuit 4 shown in FIG. 2, only a part of which is shown, said active circuit 4 being provided in the active circuit area 2 of the integrated circuit device 1 in accordance with the invention.

On a surface 5 of a semiconductor body 6 of a first conductivity type, in the present situation a silicon body of, for instance, p-type conductivity, active circuit devices 7, two of which are shown, are disposed. In the present situation, the active circuit devices 7 represent field-effect transistors, which are located at an active region 8 between field oxide regions 9. Each of the field-effect transistors has a gate electrode 10, made of, for instance, polycrystalline silicon, and source/drain regions 11 and 12 of a second, opposite conductivity type, in the present example n-type, on opposite sides of the gate electrode 10. The gate electrode 10 is isolated from the surface 5 of the silicon body 6 by a thin gate oxide 13. A first dielectric layer 14, composed of, for instance, silicon oxide, is disposed on the gate electrode 10 and the field oxide regions 9. Contact holes 15 are provided to allow a superimposed first patterned metal layer 16 to contact the surface 5 of the silicon body 6 at the location of the source/drain regions 11 and 12. The first patterned metal layer 16 is covered with a second dielectric layer 17, composed of, for instance, silicon oxide, in which vias 18 are provided to allow a superimposed second patterned metal layer 19 to contact the first patterned metal layer 16. Aluminium, either pure or as an alloy with a few percent of silicon and/or copper is commonly applied for the first and the second patterned metal layer 16 and 19. However, other suitable metals such as, tungsten and copper, or a combination of metals may be used as well. The second patterned metal layer 19 is covered with a layer 20 of passivating material, which substantially consists of inorganic material such as silicon nitride, a phosphosilicate glass (PSG) or a combination of these materials. Silicon nitride is frequently used as passivating material, since it provides an impermeable barrier to moisture and mobile impurities such as sodium and in addition forms a tough coat that protects the integrated circuit device against scratching. The layer 20 of passivating material is selectively removed at connecting areas 21 (only one area shown in FIG. 2) to allow superimposed bond pads 3 (only one bond pad shown in FIG. 2) to contact the second patterned metal layer 19. The bond pads 3 have a circuit-connecting region 22 in overlying relationship relative to one of the connecting areas 21 and a wire-bonding region 23 for bonding a wire 24, which has a typical diameter in the range between 20 and 50 µm. The wire 24 electrically connects the bond pads 3 disposed over the active circuit area 2 to an external lead structure (not shown) provided by a package (not shown) surrounding the integrated circuit device 1. In order to minimize the resistance of the wire 24 and, hence, the associated tension losses during operation of the integrated circuit device 1, the wire 24 is preferably kept as short as possible by placing the wire-bonding region 23 of the bond pads 3 at the periphery of the active circuit area 2. However, it is obvious that the bond pads 3 can be placed in the middle of the active circuit area 2 as well.

In order to minimize the complexity of the integrated circuit device and of its manufacturing process, the circuit-connecting region 22 of the bond pads 3 and the wire-bonding region 23 of the bond pads 3 are preferably part of one common layer. Aluminium, either pure or as an alloy with a few percent of silicon and/or copper, is preferably applied for the bond pads 3, because aluminium exhibits a relatively low electrical resistivity compared to other metals. Furthermore, application of pure or alloyed aluminium is compatible with the processing of previously applied metal layers, since the latter are commonly composed of pure or alloyed aluminium as well. However, other suitable metals such as, for instance, titanium:tungsten (Ti:W), silver, and copper, or a stack of, for instance, aluminium and titanium-:tungsten may be used as well. The wire 24 is frequently composed of gold, although aluminium or copper may be used as well. The choice of materials for wire and bond pads is related to the choice of wire bonding technique, that is ball bonding or wedge bonding, and the type of wire bonding process combined therewith, that is thermosonic (pressure, ultrasonic energy, temperature), ultrasonic (pressure, ultrasonic energy), or thermocompression (pressure, temperature) bonding.

Between the bond pads 3, which are disposed substantially over the active circuit area 2, and the active circuit devices 7, which are provided in the active circuit area 2, electrical connections are thus provided. These electrical connections pass through the layer 20 of passivating material, which substantially consists of inorganic material and which is substantially free from interruptions directly beneath the wire-bonding region 23 of the bond pads 3. Note that both the circuit-connecting region 22 of the bond pads 3 and the wire-bonding region 23 of the bond pads 3 are disposed over the active circuit area 2 and that the circuit-connecting region 22 is situated substantially outside of the wire-bonding region 23.

In the integrated circuit device 1 in accordance with the invention the thickness of the layer 20 of passivating material and the thickness of the bond pads 3 are chosen so that the integrated circuit device 1 is able to withstand the forces exerted during bonding of the wire 24 and, hence, is able to counteract the occurrence of damage to the active circuit 4.

Figure 3:
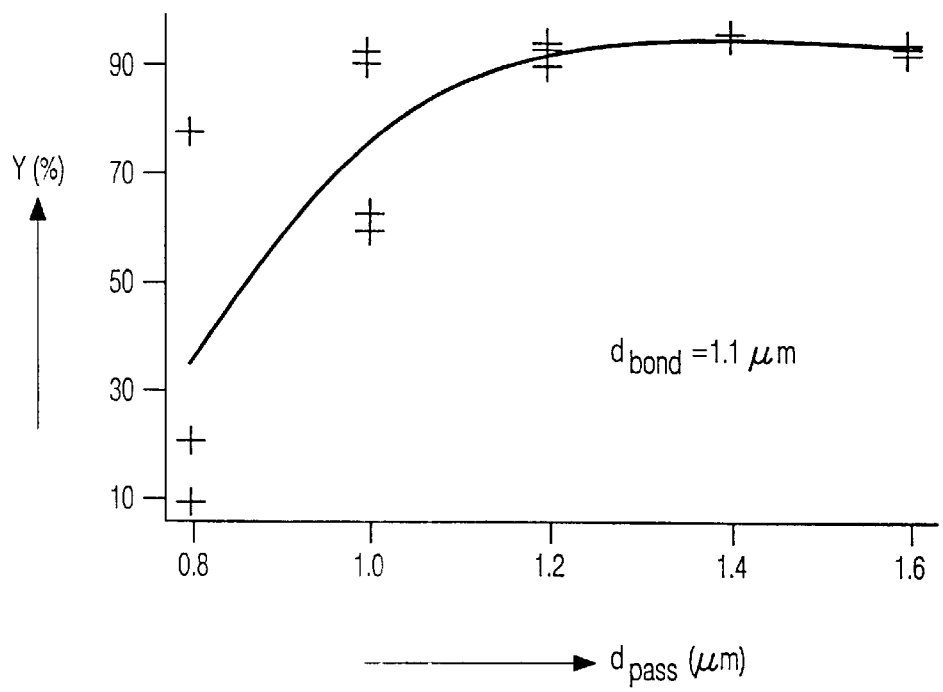
FIGS. 3 to 5 show graphs of the relationship between the overall process yield (Y in %), both experimental (crosses) and theoretical (line), after assembly of an integrated circuit device in accordance with the invention and the thickness of a layer of passivating material ($d_{pass}$ in µm) processed therein at specified thicknesses of bond pads ($d_{bond}$ in µm) used therein.
Figure 4:
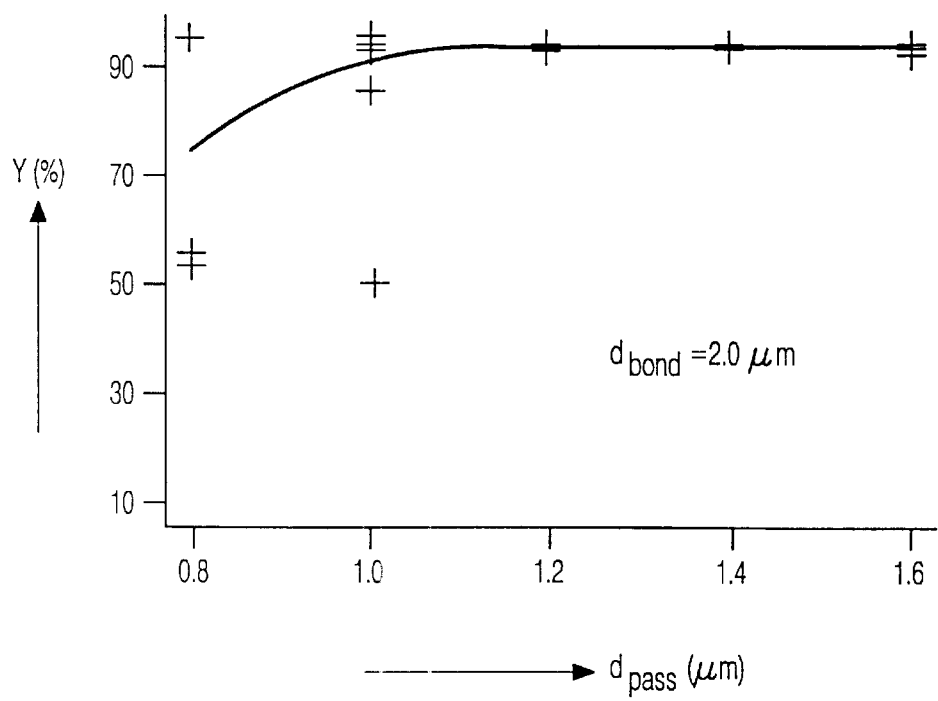
Figure 5:
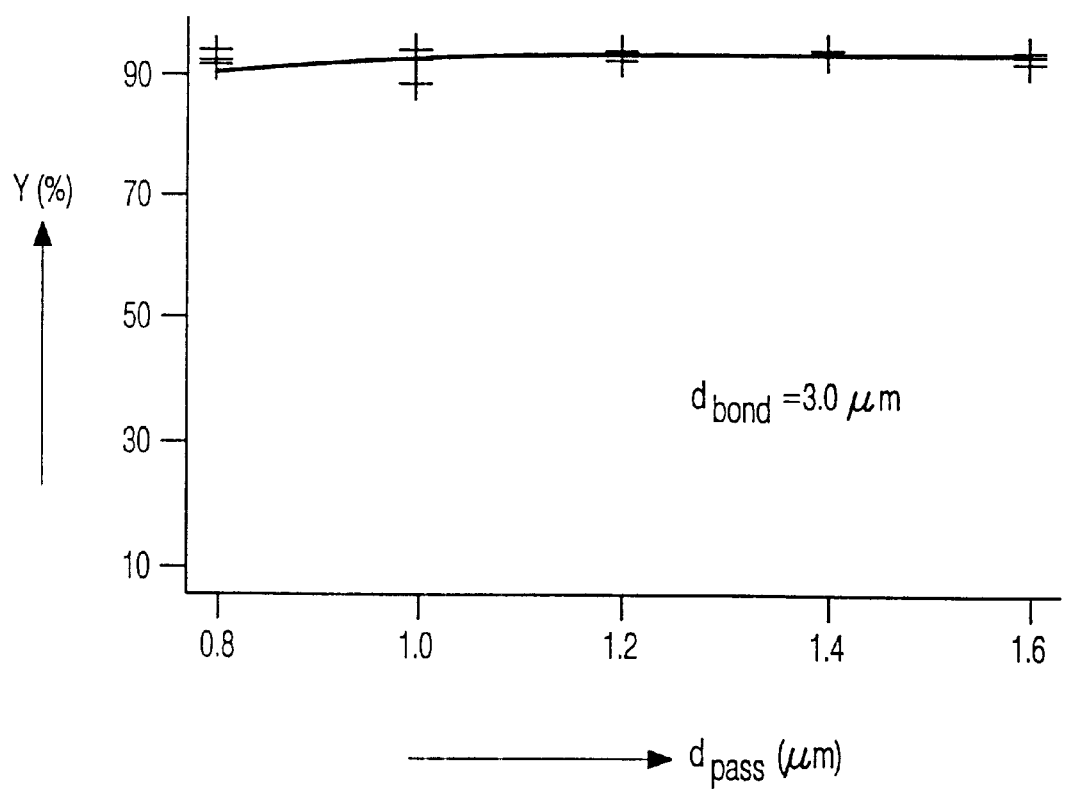

FIGS. 3 to 5 show graphs of the relationship between the overall process yield (Y in %), both experimental (crosses) and theoretical (line), after assembly of an integrated circuit device in accordance with the invention and the thickness of a layer of passivating material ($d_{pass}$ in $\mu$m) processed therein at specified thicknesses of the bond pads ($d_{bond}$ in $\mu$m) used therein. The layer of passivating material consists of silicon nitride and has been applied by means of plasma-enhanced chemical vapor deposition (PECVD) at a temperature of about 400° C. The bond pads mainly consist of aluminium and have been applied by means of physical vapor deposition (PVD) at a temperature of about 350° C. Wires composed of gold with diameters of 20 and 25 $\mu$m have been bonded by means of thermosonic ball bonding at a bond force between 25 and 45 grams, an ultrasonic bond power between 35 and 60 mW, and a bond temperature of about 220° C. during a bond time between 12 and 20 ms.

Note that the theoretical overall process yield has been calculated on the basis of a model equation derived from results obtained from a representative design-of-experiment. The theoretical overall process yield adequately describes the experimental overall process yield in a region where the latter starts to level off. In this region the experimental overall process yield reaches a value comparable to that obtained during manufacturing conventional integrated circuit devices having the bond pads arranged peripherally outside of the active circuit area. Outside of this region the fit between the theoretical and the experimental overall process yield is less satisfactory due to a relatively large spread in experimental data.

The results presented in FIG. 3 reveal that an experimental overall process yield of about 90% or higher is accomplished if the layer of passivating material is applied in a thickness of at least 1.2 $\mu$m and the bond pads are applied in a thickness of at least 1.1 $\mu$m. An experimental overall process yield of at least 90% is an indication that the integrated circuit device in accordance with the invention is able to withstand the bond forces. Moreover, in order to ensure an experimental overall process yield equal to that obtained during manufacturing conventional integrated circuit devices having the bond pads arranged peripherally outside of the active circuit area, it is preferred to apply the layer of passivating material in a thickness in the range of about 1.4 to 2.0 $\mu$m and to provide the bond pads in a thickness in the range of about 2 to 3 $\mu$m (FIGS. 4 and 5).

It will be evident to those skilled in the art that the integrated circuit device in accordance with the invention can be successfully wire-bonded irrespective of the wire bonding technique applied, that is ball bonding or wedge bonding, and the type of wire bonding process combined therewith, that is thermosonic, ultrasonic or thermocompression bonding.

Furthermore, instead of an interconnect structure comprising two patterned metal layers, the integrated circuit device in accordance with the invention may possess an interconnect structure comprising one or more than two patterned metal layers. Moreover, instead of providing electrical connections between the bond pads and the active circuit devices through electrically connecting the bond pads with an upper patterned metal layer of the interconnect structure, it will be apparent that the electrical connections can be provided also through electrically connecting the bond pads with lower patterned metal layers, if present.

The integrated circuit device in accordance with the invention can be readily manufactured by those skilled in the art using standard silicon technology processes. A description of suitable processes is therefore omitted.

What is claimed is:

1. An integrated circuit device comprising:
   an active circuit provided in an active circuit area at a surface of a semiconductor body, said active circuit comprising active circuit devices, said active circuit further comprising an interconnect structure comprising at least one patterned metal layer disposed in overlying relationship relative to the active circuit devices and a layer of passivating material disposed atop the interconnect structure,
   a plurality of bond pads, each of said bond pads providing a wire-bonding region for bonding a wire, said bond pads being disposed substantially over the active circuit area,
   electrical connections between the bond pads and the active circuit devices, said electrical connections extending from a circuit-connecting region provided by the bond pads and passing through the layer of passivating material, characterized in that
   the circuit-connecting region of the bond pads is situated substantially outside of the wire-bonding region of the bond pads,
   the layer of passivating material substantially consists of inorganic material,
   the layer of passivating material beneath the wire-bonding region of the bond pads is substantially free from interruptions,
   the layer of passivating material and the bond pads have thicknesses that jointly counteract the occurrence of damage to the active circuit during bonding of the wire.

2. An integrated circuit device as claimed in claim 1, characterized in that the wire-bonding region of the bond pads and the circuit-connecting region of the bond pads are part of one common layer.

3. An integrated circuit device as claimed in claim 1, characterized in that the wire-bonding region of the bond pads is located substantially at the periphery of the active circuit area.

4. An integrated circuit device as claimed in claim 1, characterized in that the bond pads comprise aluminium.

5. An integrated circuit device as claimed in claim 1, characterized in that the layer of passivating material comprises silicon nitride.

6. An integrated circuit device as claimed in claim 5, characterized in that the layer of passivating material has a thickness of at least 1.2 $\mu$m and that the bond pads comprise aluminum and have a thickness of at least 1.1 $\mu$m.

7. An integrated circuit device as claimed in claim 6, characterized in that the layer of passivating material has a thickness in the range of about 1.4 to 2.0 $\mu$m and that the bond pads have a thickness in the range of about 2 to 3 $\mu$m.

8. An integrated circuit device as claimed in claim 1, characterized in that the wire comprises gold.

* * * * *